(12) United States Patent
Anderson et al.

(10) Patent No.: US 9,673,199 B1
(45) Date of Patent: Jun. 6, 2017

(54) GATE CUTTING FOR A VERTICAL TRANSISTOR DEVICE

(71) Applicant: International Business Machines Corporation, Armonk, NY (US)

(72) Inventors: Brent A. Anderson, Jericho, VT (US); Sivananda K. Kanakasabapathy, Niskayuna, NY (US); Stuart A. Sieg, Albany, NY (US); John R. Sporre, Albany, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/188,510

(22) Filed: Jun. 21, 2016

(51) Int. Cl.
| | |
|---|---|
| *H01L 29/78* | (2006.01) |
| *H01L 21/82* | (2006.01) |
| *H01L 27/092* | (2006.01) |
| *H01L 21/8238* | (2006.01) |
| *H01L 29/66* | (2006.01) |
| *H01L 21/308* | (2006.01) |
| *H01L 21/306* | (2006.01) |

(52) U.S. Cl.
CPC ...... *H01L 27/0924* (2013.01); *H01L 21/3085* (2013.01); *H01L 21/30604* (2013.01); *H01L 21/823807* (2013.01); *H01L 21/823821* (2013.01); *H01L 29/66795* (2013.01); *H01L 29/7856* (2013.01)

(58) Field of Classification Search
CPC ... H01L 29/66; H01L 29/667; H01L 29/6679; H01L 29/66795; H01L 29/78; H01L 29/785; H01L 29/7856; H01L 27/09; H01L 27/0924; H01L 21/30; H01L 21/306; H01L 21/306; H01L 21/30604; H01L 21/308; H01L 21/3085; H01L 21/82; H01L 21/823; H01L 21/8238; H01L 21/8238; H01L 21/823807; H01L 21/82382; H01L 21/823821
USPC .................................................. 257/329
See application file for complete search history.

(56) References Cited

U.S. PATENT DOCUMENTS

| | | |
|---|---|---|
| 6,724,031 B1 | 4/2004 | Akatsu et al. |
| 7,935,599 B2 | 5/2011 | Crowder et al. |
| 8,207,032 B2 * | 6/2012 | Fischer ........... H01L 21/823425 438/206 |
| 8,263,496 B1 | 9/2012 | Wodecki |
| 8,334,083 B2 | 12/2012 | Luong et al. |
| 8,786,004 B2 | 7/2014 | Park et al. |
| 8,916,337 B2 | 12/2014 | Arnold et al. |
| 8,986,921 B2 | 3/2015 | Edelstein et al. |

(Continued)

*Primary Examiner* — Monica D Harrison
(74) *Attorney, Agent, or Firm* — Cantor Colburn LLP; Vazken Alexanian

(57) ABSTRACT

A method of gate cutting for a device with multiple vertical transistors is provided. The method includes memorizing an initial structure of the device to identify a location for a gate strap to connect a portion of the multiple vertical transistors, building a bilayer hard mask over the device with a photoresist (PR) opening at the location, removing successive layers of the bilayer hard mask to identify first and second sections of the device based on a position of the PR opening and removing remaining layers of the bilayer hard mask and the first section of the device while preserving the second section of the device to form the gate strap.

20 Claims, 12 Drawing Sheets

(56) References Cited

U.S. PATENT DOCUMENTS

| | | |
|---|---|---|
| 9,087,739 B2 | 7/2015 | Dunn et al. |
| 9,224,842 B2 | 12/2015 | Bouche et al. |
| 2014/0199628 A1 | 7/2014 | Edelstein et al. |
| 2016/0042969 A1 | 2/2016 | Mohanty |
| 2016/0071774 A1 | 3/2016 | Wei et al. |
| 2016/0079242 A1 | 3/2016 | Bouche et al. |

* cited by examiner

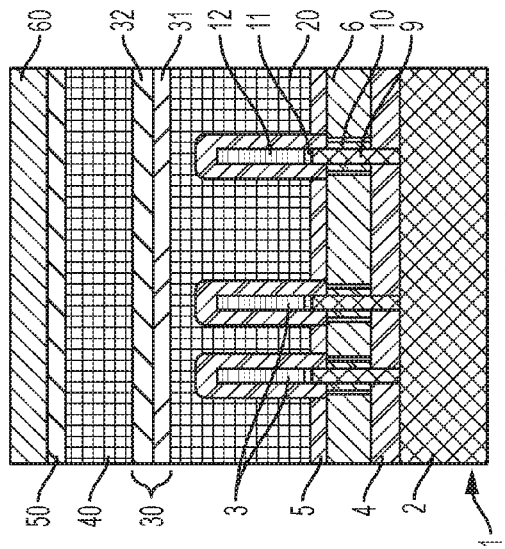
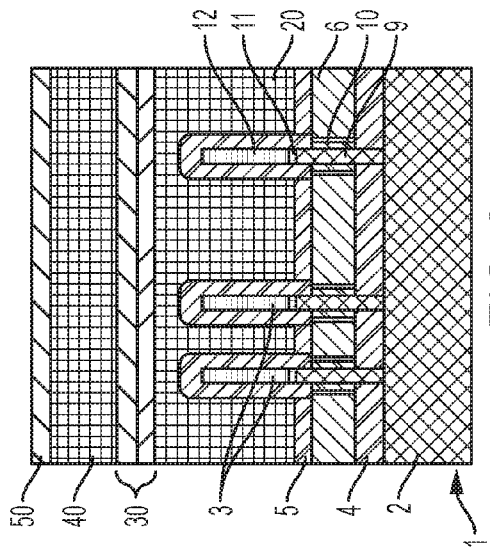
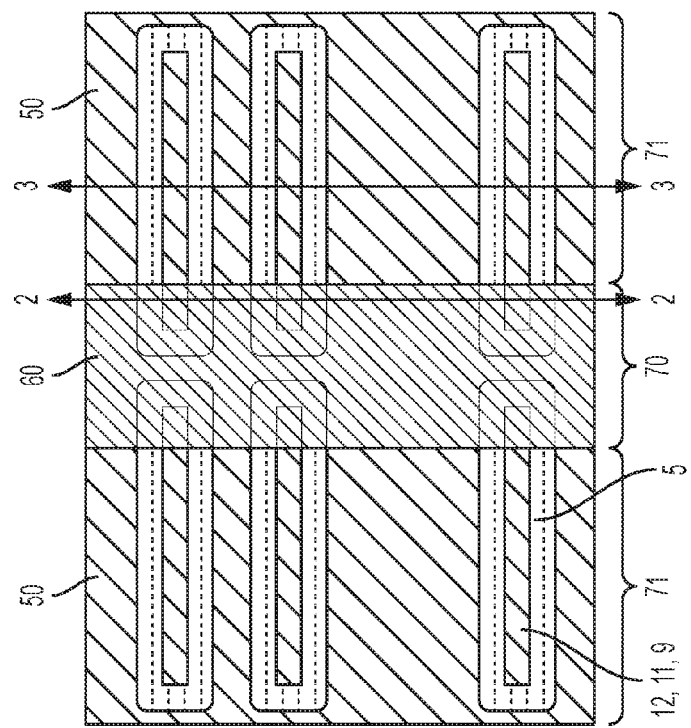

GATE CUTTING FOR A VERTICAL TRANSISTOR DEVICE

BACKGROUND

The present invention relates to semiconductor devices, and more specifically, to gate cutting methods for vertical transistor devices.

As demands to reduce the dimensions of transistor devices continue, new designs and fabrication techniques to achieve a reduced device footprint are developed. Vertical-type transistors such as vertical field effect transistors (vertical FETs or VFETs) have recently been developed to achieve a reduced FET device footprint without comprising necessary FET device performance characteristics.

However, when devices that include multiple VFETs are formed, they often include an underlying metallic layer by which each of the VFETs are communicative. This underlying metallic layer often needs to be cut. However, cutting the underlying metallic layer without damaging the rest of the device is difficult.

SUMMARY

According to a non-limiting embodiment of the present invention, a method of gate cutting for a device with multiple vertical transistors is provided and includes memorizing an initial structure of the device to identify a location for a gate strap to connect a portion of the multiple vertical transistors. The method further includes building a bilayer hard mask over the device with a photoresist (PR) opening at the location. The method further includes removing successive layers of the bilayer hard mask to identify first and second sections of the device based on a position of the PR opening, and then removing remaining layers of the bilayer hard mask and the first section of the device while preserving the second section of the device to form the gate strap.

According to another non-limiting embodiment, a method of gate cutting for a device is provided and includes forming the device to include multiple vertical transistors, an upper spacer and an underlying metallic layer by which each of the multiple vertical transistors are communicative. The method further includes identifying a section of the device to be removed such that first and second groups of the multiple vertical transistors are isolated and removing respective portions of the upper spacer and the underlying metallic layer at the section of the device to isolate the first and second groups of the multiple vertical transistors.

According to yet another non-limiting embodiment, a vertical transistor device is provided and includes a semiconductor substrate, first and second groups of vertical transistors extending upwardly from the semiconductor substrate, a lower spacer disposed about fins of each of the vertical transistors, and an underlying metallic layer disposed to isolate the vertical transistors of the first group from the vertical transistors of the second group. The underlying metallic layer includes first and second sections by which the vertical transistors of the first and second groups are communicative, respectively, and an upper spacer disposed about upper portions of each of the vertical transistors. The upper spacer defines an opening associated with a region separating the first and second sections.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-34 are a series of views illustrating a method of gate cutting according to exemplary embodiments of the present teachings, in which:

FIG. 1 is a top-down view of a bilayer memorization stack on an initial structure of a device;

FIG. 2 is a cross-section of the bilayer memorization stack and the initial structure of the device along line 2-2 of FIG. 1;

FIG. 3 is a cross-section of the bilayer memorization stack and the initial structure of the device along line 3-3 of FIG. 1;

FIG. 4 is a top-down view of an etched bilayer memorization stack on an initial structure of a device;

FIG. 5 is a cross-section of the etched bilayer memorization stack and the initial structure of the device along line 5-5 of FIG. 4;

FIG. 6 is a cross-section of the etched bilayer memorization stack and the initial structure of the device along line 6-6 of FIG. 4;

FIG. 7 is a top-down view of an etched bilayer memorization stack on an initial structure of a device;

FIG. 8 is a cross-section of the etched bilayer memorization stack and the initial structure of the device along line 8-8 of FIG. 7;

FIG. 9 is a cross-section of the etched bilayer memorization stack and the initial structure of the device along line 8-8 of FIG. 7;

FIG. 10 is a top-down view of an etched bilayer memorization stack on an initial structure of a device;

FIG. 11 is a cross-section of the etched bilayer memorization stack and the initial structure of the device along line 11-11 of FIG. 10;

FIG. 12 is a cross-section of the etched bilayer memorization stack and the initial structure of the device along line 12-12 of FIG. 10;

FIG. 13 is a top-down view of a bilayer hard mask on an initial structure of a device;

FIG. 14 is a cross-section of the bilayer hard mask of the device along line 14-14 of FIG. 13;

FIG. 15 is a cross-section of the bilayer hard mask of the device along line 15-15 of FIG. 13;

FIG. 16 is a top-down view of an etched bilayer hard mask on an initial structure of a device;

FIG. 17 is a cross-section of the etched bilayer hard mask of the device along line 17-17 of FIG. 16;

FIG. 18 is a cross-section of the etched bilayer hard mask of the device along line 18-18 of FIG. 16;

FIG. 19 is a top-down view of an etched bilayer hard mask on an initial structure of a device;

FIG. 20 is a cross-section of the etched bilayer hard mask of the device along line 20-20 of FIG. 19;

FIG. 21 is a cross-section of the etched bilayer hard mask of the device along line 21-21 of FIG. 19;

FIG. 22 is a top-down view of an etched bilayer hard mask on an initial structure of a device;

FIG. 23 is a cross-section of the etched bilayer hard mask of the device along line 23-23 of FIG. 22;

FIG. 24 is a cross-section of the etched bilayer hard mask of the device along line 24-24 of FIG. 22;

FIG. 25 is a top-down view of an etched bilayer hard mask on an initial structure of a device;

FIG. 26 is a cross-section of the etched bilayer hard mask of the device along line 26-26 of FIG. 25;

FIG. 27 is a cross-section of the etched bilayer hard mask of the device along line 27-27 of FIG. 25;

FIG. 28 is a top-down view of an etched bilayer hard mask on an initial structure of a device;

FIG. 29 is a cross-section of the etched bilayer hard mask of the device along line 29-29 of FIG. 29;

FIG. 30 is a cross-section of the etched bilayer hard mask of the device along line 30-30 of FIG. 29;

FIG. 31 is a top-down view of an etched bilayer hard mask on an initial structure of a device;

FIG. 32 is a cross-section of the etched bilayer hard mask of the device along line 32-32 of FIG. 31;

FIG. 33 is a cross-section of the etched bilayer hard mask of the device along line 33-33 of FIG. 31;

FIG. 34 is a top-down view of an etched device;

DETAILED DESCRIPTION

Figure 5:
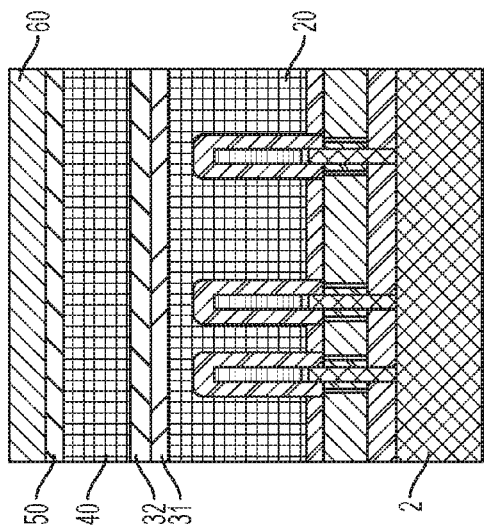

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect.

Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of a coupler system according to the present disclosure utilize a variety of individually known physical and chemical processes performed on a semiconductor (e.g., silicon) substrate.

In general, the various processes used to form a microchip that will be packaged into an IC fall into three categories, namely, film deposition, patterning, etching and semiconductor doping. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present disclosure, one or more embodiments provide for a pad or gate strap that connects gates of vertical transistors, such as vertical field effect transistors or VFETs, which wrap around fins of the vertical transistors in a given device before final gate structures are formed. The device may be a transistor device, such as a VFET device or another similar type of device.

Turning now to a more detailed discussion of one or more embodiments, VFET process flow often requires gate strapping with a phase-bar (PB) mask but, at desired dimensions, it may be necessary to include a computed tomography (CT) mask to cut the PB mask features where desired and this cannot be done by simple tri-layer patterning given the requirements of incorporating a gate cut into the patterning flow. Thus, an organic planarizing layer is disposed on top of a device including multiple n and p-type VFET fins and is coupled with a bilayer memorization layer and then an additional patterning trilayer stack. This provides for a unique method of forming a mask for patterning a gate strap between the n and p-type fins.

With reference now to FIGS. 1-3, a goal of the description provided herein is to build a pad or gate strap that connects gates that wrap around fins of various VFETs in a given device before actually forming final gate structures. The given device may be a transistor device, such as a VFET device 1 or another similar type of device. For purposes of clarity and brevity, however, the following description will relate only to the VFET device 1 case.

As shown in FIG. 2 and in FIG. 3, the VFET device 1 includes a semiconductor substrate 2 that is formed of silicon (Si) or silicon-germanium (SiGe) and may be provided as a one-layer substrate or in a silicon-on-insulator (SOI) configuration. The VFET device 1 also includes multiple VFETs 3 as well as a bottom spacer 4, a top spacer 5 and a recessed metallic layer 6. The multiple VFETs 3 may include n-type VFETs and p-type VFETs. Each of the multiple VFETs 3 includes a fin 9 that extends vertically upwardly from the semiconductor substrate 1, a metal gate assembly 10 surrounding a central portion of the fin 9, an oxide layer 11 disposed on an upper edge of the fin 9 and a hard mask 12 disposed on an upper edge of the oxide layer 11. The bottom spacer 4 extends along an upper surface of the semiconductor substrate 2 and surrounds lower portions of the fins 9 and the top spacer 5 surrounds upper portions of the fins 9, the oxide layers 11 and the hard masks 12. The bottom spacer 4 and the top spacer 5 may both be formed of silicon nitride (SiN) or another similar material. The recessed metallic layer 6 is disposed between the bottom spacer 4 and the top spacer 5 and is provided to permit communication (e.g., electrical conductivity) between each of the metal gate assemblies 10. The recessed metallic layer 6 may be formed of tungsten (W) or another similar metallic material. The fins 9 may be formed of similar materials as the semiconductor substrate 2.

With the VFET device 1 configured as shown in FIGS. 2 and 3, in particular, and as described above, the method begins with a first organic planarizing layer (OPL) 20 being deposited over the VFET device 1, a bilayer memorization stack 30 being deposited over the OPL 20, a second OPL 40 being deposited over the bilayer memorization stack 30, a low temperature oxide layer (LTO) 50 is deposited over the second OPL 40 and a photoresist layer (PR) 60 is deposited over the LTO 50 at a location where a gate strap is to be formed (see the PR 60 in FIG. 2 but not FIG. 3). In accordance with embodiments, the bilayer memorization stack 30 may include a low temperature deposited nitride layer (LTN) 31 (see FIG. 2) and an LTO 32 (see FIG. 2) atop the LTN 31 and the LTO 50 may include an oxide anti-reflective coating layer.

Figure 6:
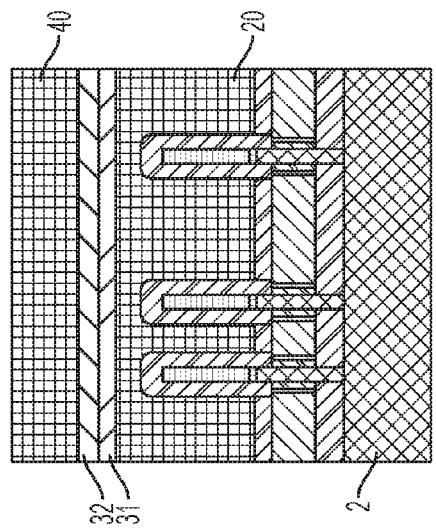
Figure 4:
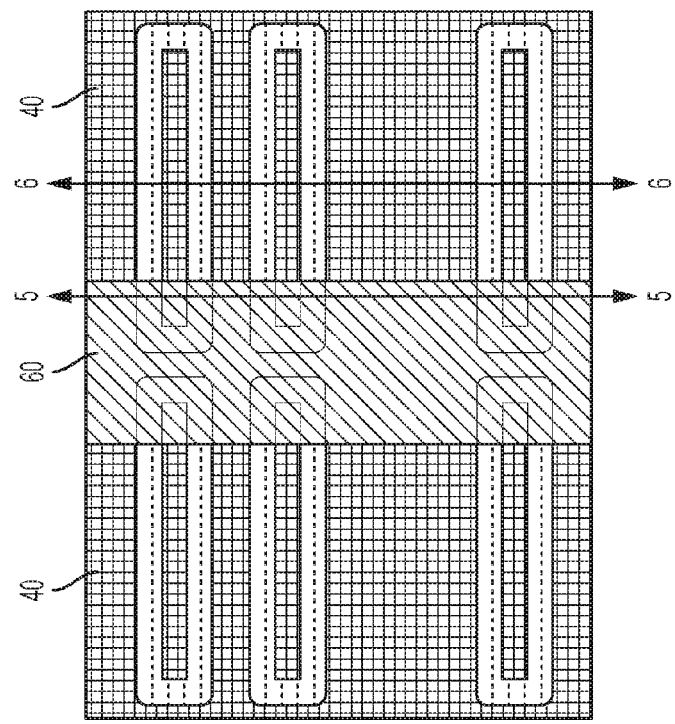

The deposition of the PR 60 is conducted along a first band 70 and thus defines second bands 71 that sandwich the first band 70 (see FIG. 1). Thus, it is seen with reference to FIGS. 4-6, that a next stage of the method includes using the PR 60 as a mask to etch the LTO 50 in the second bands 71 as shown in FIG. 6 without affecting the PR 60 in the first band 70 as shown in FIG. 5. The etching in this instance may include reactive ion etching (RIE) or other similar etching processes.

Figure 8:
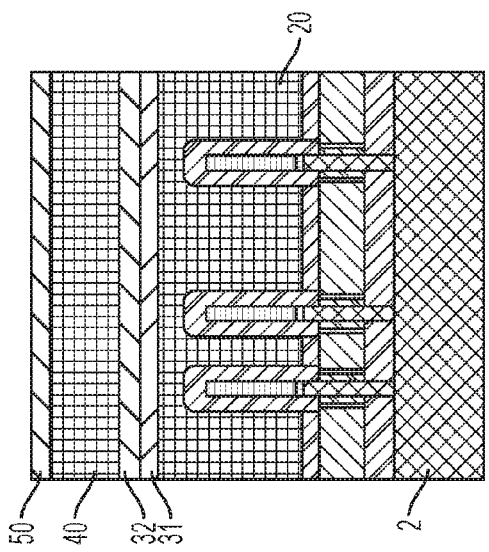
Figure 9:
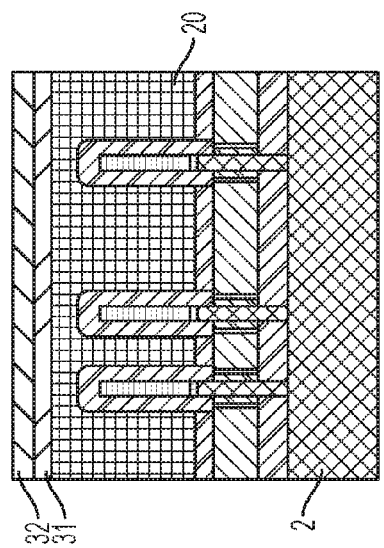
Figure 7:
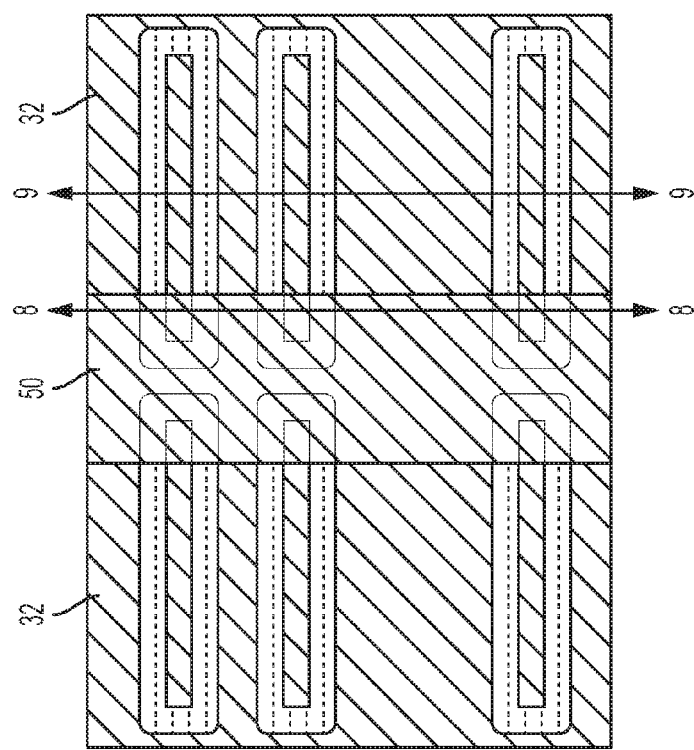

With reference to FIGS. 7-9, the etching described above with reference to FIGS. 4-6 is followed by an etch of the second OPL 40 at the second bands 71 as shown in FIG. 9 and a concurrent etch of the PR 60 in the first band 70 as shown in FIG. 8. Such etching is enabled by the fact that the second OPL 40 and the PR 60 are generally formed of similar organic materials and are thus able to be etched by correspondingly similar etchants. Indeed, embodiments exist in which the second OPL 40 and the PR 60 cannot be selectively etched with respect to one another.

Figure 11:
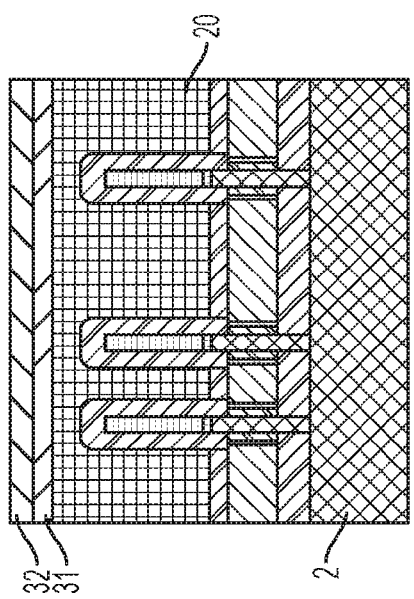
Figure 12:
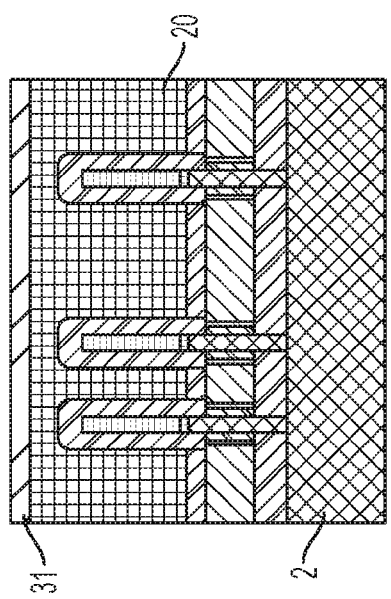
Figure 10:
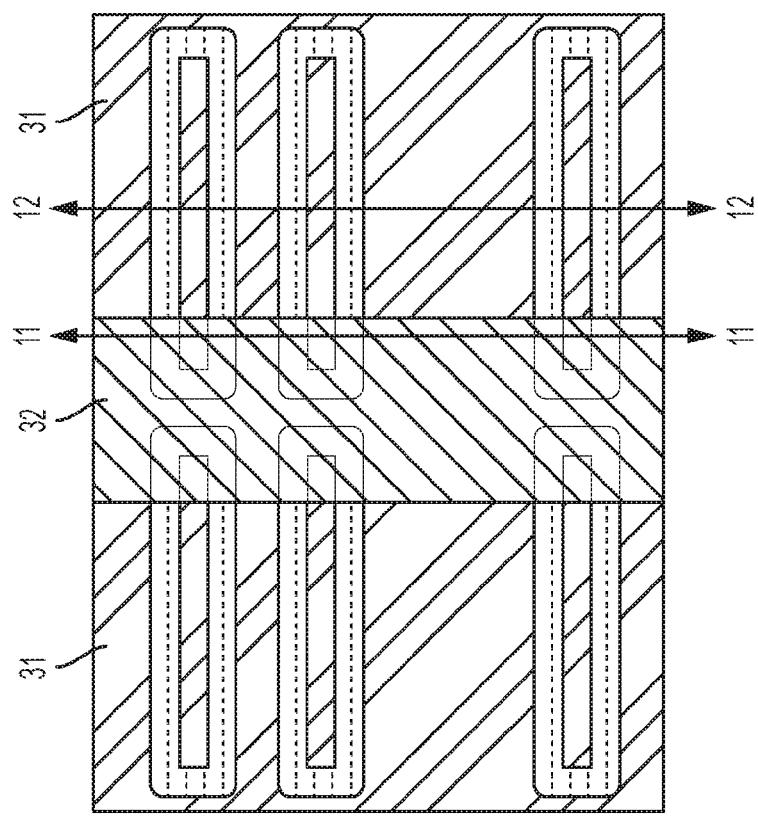

At this point, with reference to FIGS. 10-12, the retained portion of the OPL 20, the LTN 31 and the LTO 32 in the first band 70 as shown in FIG. 11 are used to memorize an initial gate strap pattern. This is accomplished by an etching of the LTO 50 and the OPL 40 in the first band 71 by, for example, RIE, and a corresponding etching of the LTO 32 in the second bands 71 with remaining organic material being washed away with plasma. Meanwhile, as shown in FIG. 12, the LTN 31 at the second bands 71 prevents the ash from etching the OPL 20 in the second bands 71.

Figure 14:
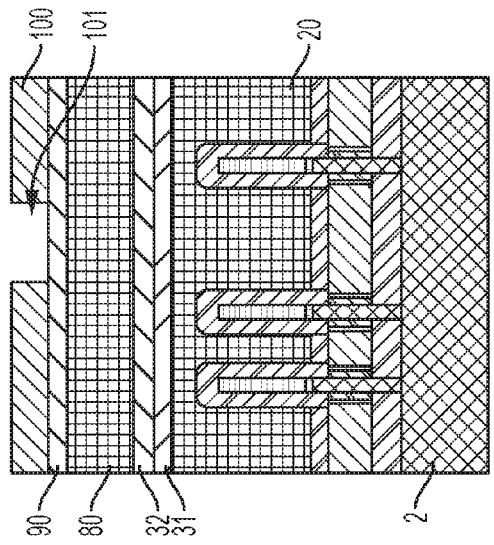
Figure 15:
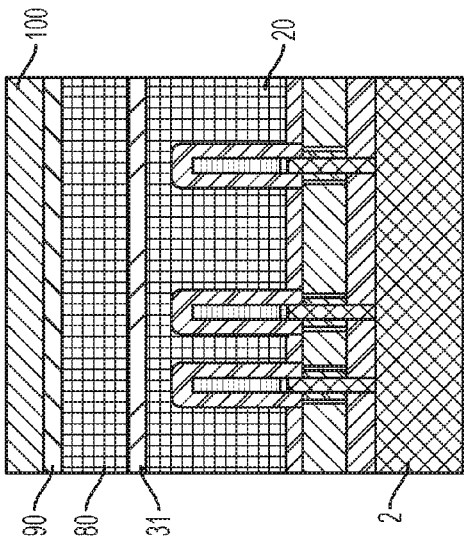
Figure 13:
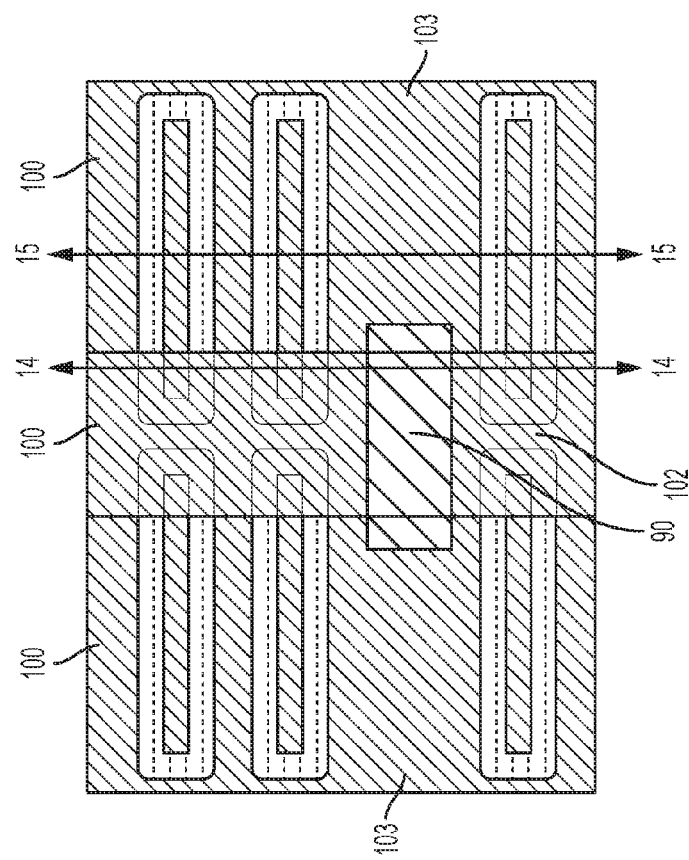

With reference now to FIGS. 13-15, it is noted that because the initial structure of the VFET device 1 that was memorized into the LTO 32 in the first band 70 is too large of a feature and needs to be cut in certain areas, the above-described processes are partially repeated with the intent to remove the LTO 32 in only certain areas. Thus, a new OPL 80 is deposited in the first band 70 over the LTO 32 (see FIG. 14) and in the second bands 71 over the LTN 31 (see FIG. 15), a new LTO 90 is deposited over the new OPL 80 in the first band 70 (see FIG. 14) and the second bands 71 (see FIG. 15) and a new PR 100 is deposited over the new OPL in the first band 70 (see FIG. 14) and the second bands 71 (see FIG. 15). In addition, as shown in FIG. 13 and FIG. 14, a PR opening 101 is left in the new PR 100 where the LTO 32 is to be cut while a first PR remainder 102 remains in the first band 70 (see FIG. 14) and a second PR remainder 103 remains in the second bands 71 (see FIG. 15).

Figure 17:
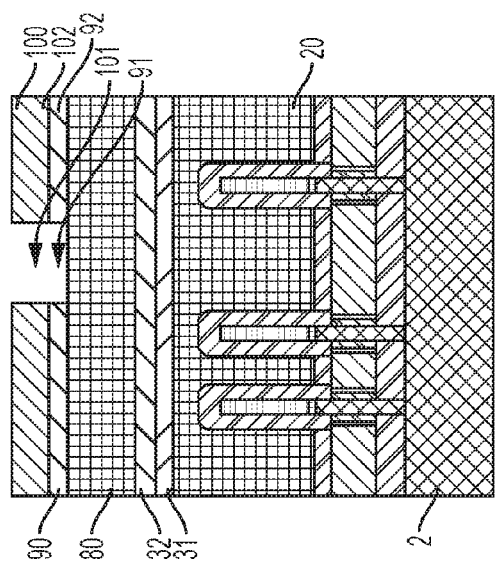
Figure 18:
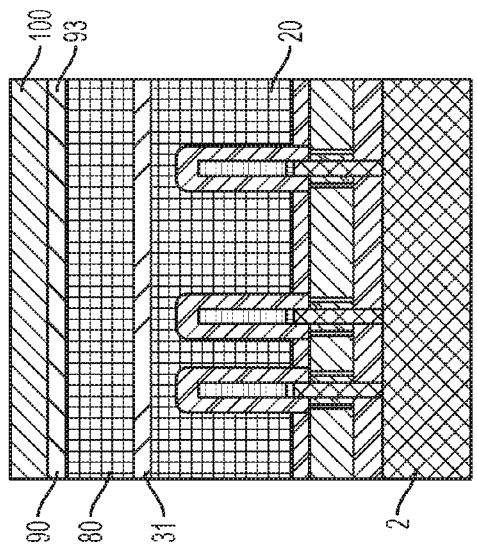
Figure 16:
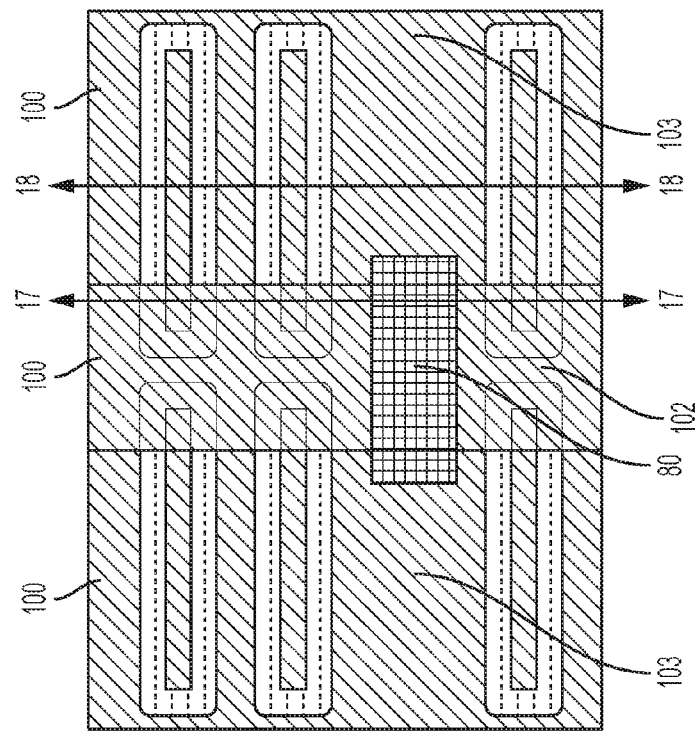

With reference to FIGS. 16-18, a next stage in the method involves the removal of a portion of the new LTO 90 at the location of the PR opening 101 as shown in FIG. 17. The removal of the portion of the new LTO 90 may be conducted by etching or ME, for example, using an etchant that is selective to the new PR 100. This results in the formation of an LTO opening 91 and the preservation of a first LTO remainder 92 in the first band 70 below the first PR remainder 102 (see FIG. 17) and a second LTO remainder 93 in the second bands 71 below the second PR remainder 103 (see FIG. 18).

Figure 20:
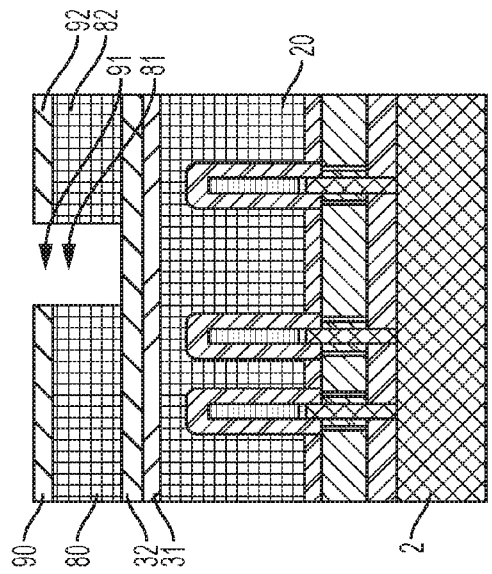
Figure 21:
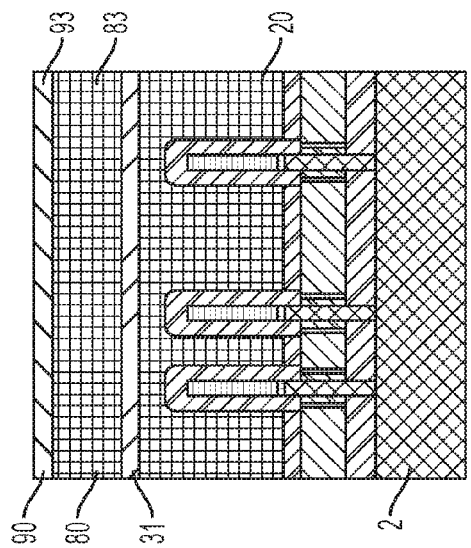
Figure 19:
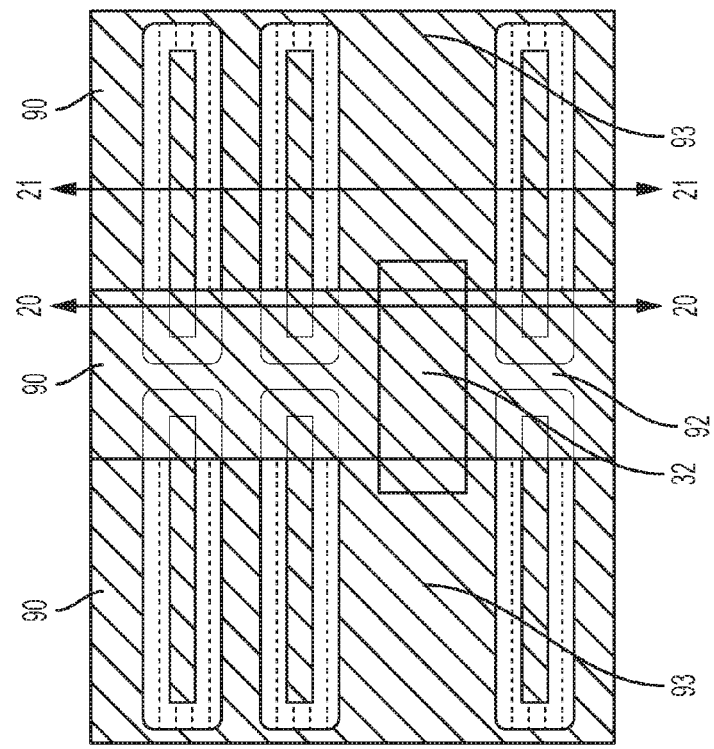

Once the portion of the new LTO 90 is removed, with reference to FIGS. 19-21, a next stage in the method involves the removal of a portion of the new OPL 80 at the location of the LTO opening 91 as shown in FIG. 20. The removal of the portion of the new OPL 80 may be conducted by etching or RIE, for example, and results in the formation of an OPL opening 81 and the preservation of a first OPL remainder 82 in the first band 70 below the first LTO remainder 92 (see FIG. 20) and a second OPL remainder 83 in the second bands 71 below the second LTO remainder 93 (see FIG. 21).

Figure 23:
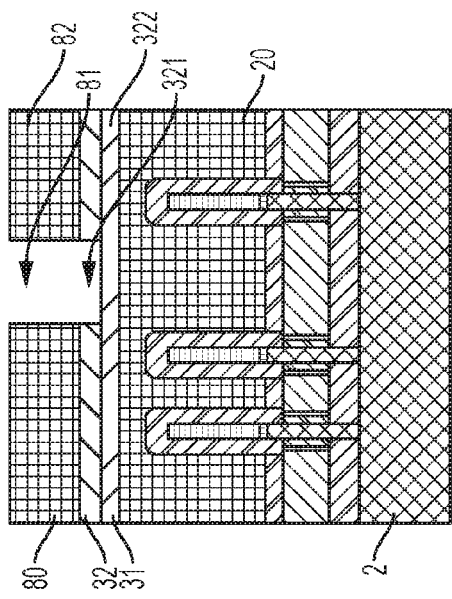
Figure 24:
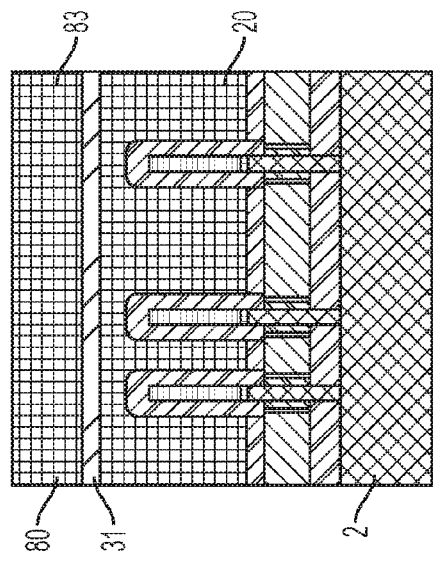
Figure 22:
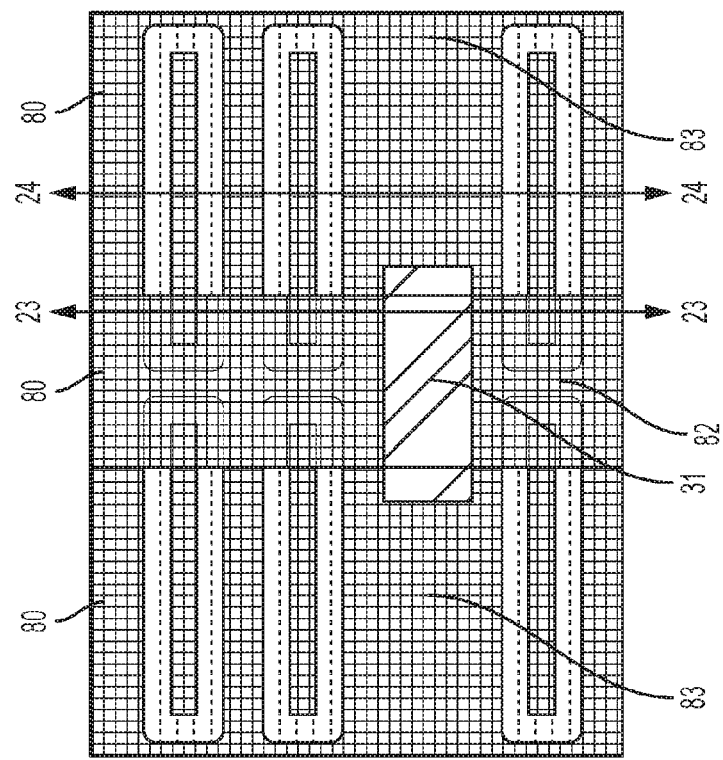

Once the portion of the new OPL 80 is removed, with reference to FIGS. 22-24, a next stage in the method involves the removal of a portion of the LTO 32 at the location of the OPL opening 81 as shown in FIG. 23. The removal of the portion of the LTO 32 may be conducted by etching or ME, for example, and results in the formation of an LTO opening 321 and the preservation of an LTO remainder 322 in the first band 70 below the first OPL remainder 82 (see FIG. 23) and a continued preservation of the second OPL remainder 83 in the second bands 71 (see FIG. 24).

Figure 26:
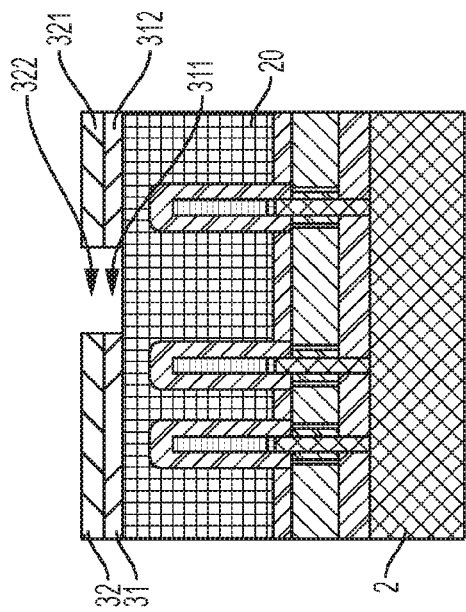
Figure 27:
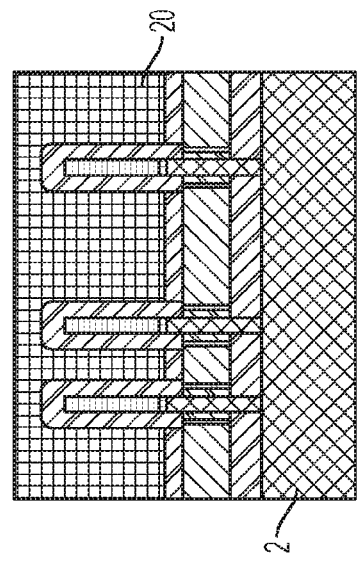
Figure 25:
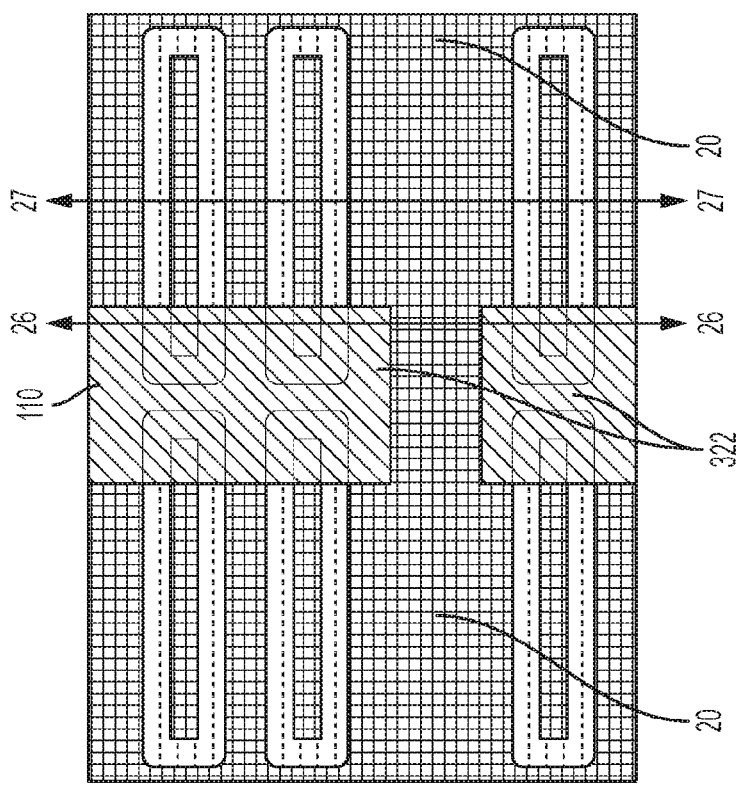

With reference to FIGS. 25-27, the next stages of the method involve the removal of the first and second OPL remainders 83 and 83 in the first band 70 and the second bands 71, respectively, and a subsequent removal of the LTN 31 through the LTO opening 321 in the first band 70 and the LTN 31 in the second bands 71. The removal of the first and second OPL remainders 82 and 83 may be accomplished by ashing and the subsequent removal of the LTN 31 may be accomplished by etching or ME, for example, such that an LTN opening 311 is defined in an LTN remainder 312 below the LTO remainder 322 in the first band 70 (see FIG. 26). The resulting structure includes a hard mask 110 in the first band 71 that is formed of the LTO remainder 322 and the LTN remainder 312.

In other words, because the LTO 32 was cut, the LTO 32 can be used as a mask to etch the underlying LTN 31. Thus, at a desired gate strap location (i.e., along the first band 70 and on either side of the LTO opening 321 and the LTN opening 311), a bilayer nitride/oxide hard mask (i.e., the hard mask 110) remains over the OPL 20.

Figure 29:
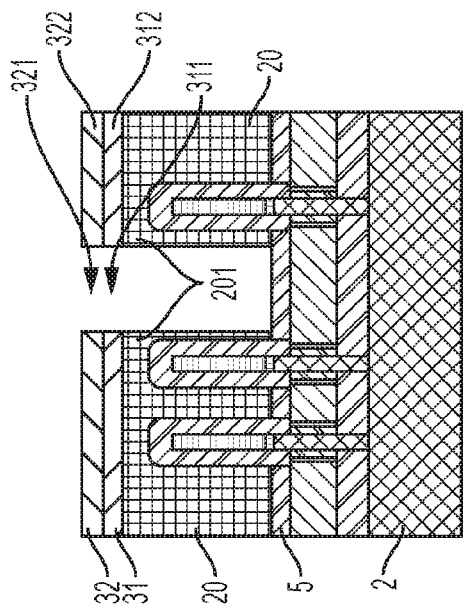
Figure 30:
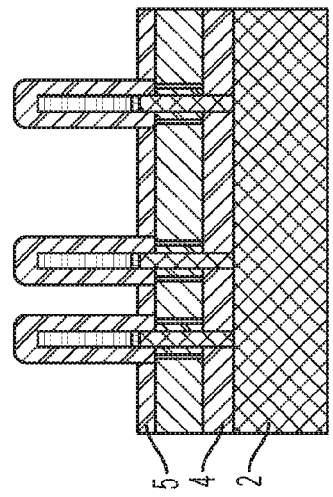
Figure 28:
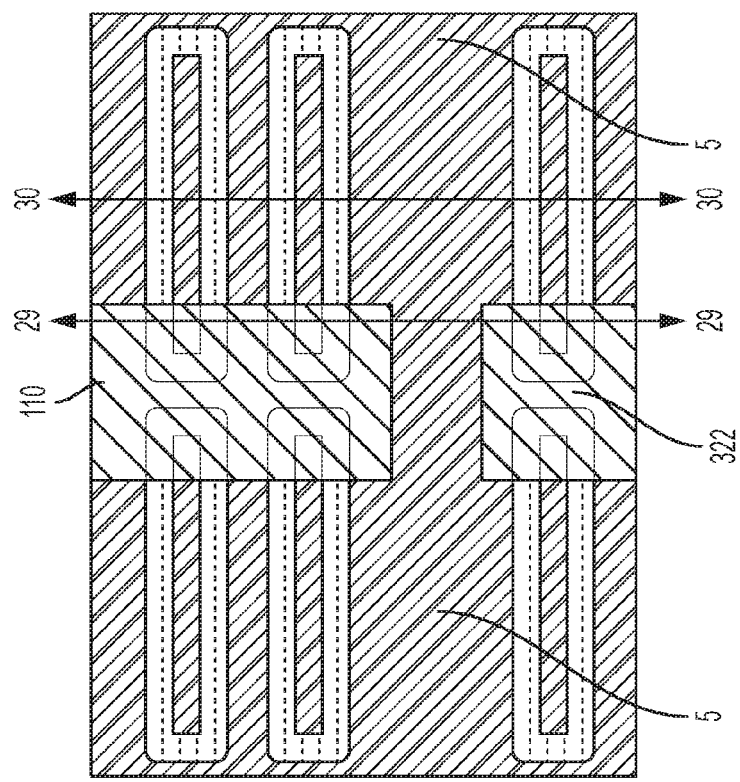

At this point, with reference to FIGS. 28-30, portions of the OPL 20 that are not masked by the LTO remainder 322 and the LTN remainder 312 are removed in the first band 70 at the LTO opening 322 and the LTN opening 312 as shown in FIG. 29 and in the second bands 71 as shown in FIG. 30. This removal may be conducted by etching or ME, for example, using an etchant that is selective to the material of the top spacer 5. This removal results in the formation of an OPL remainder 201 below the LTO remainder 322 and the LTN remainder 312 while exposing a top surface of the top spacer 5 in the first band 70 at the LTO opening 322 and the LTN opening 312 (see FIG. 29) and in the second bands 71 (see FIG. 30).

Figure 32:
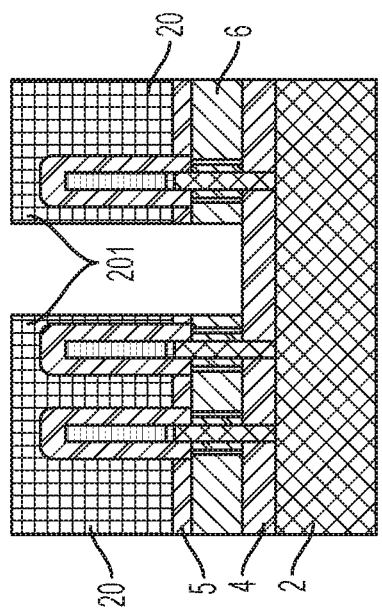
Figure 33:
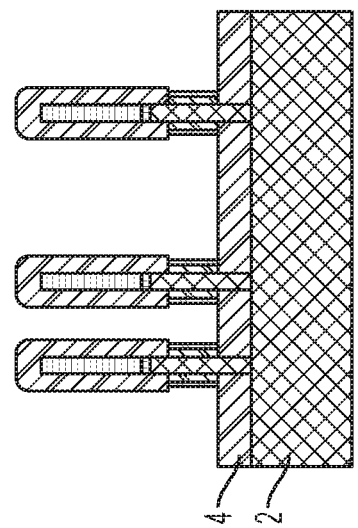
Figure 31:
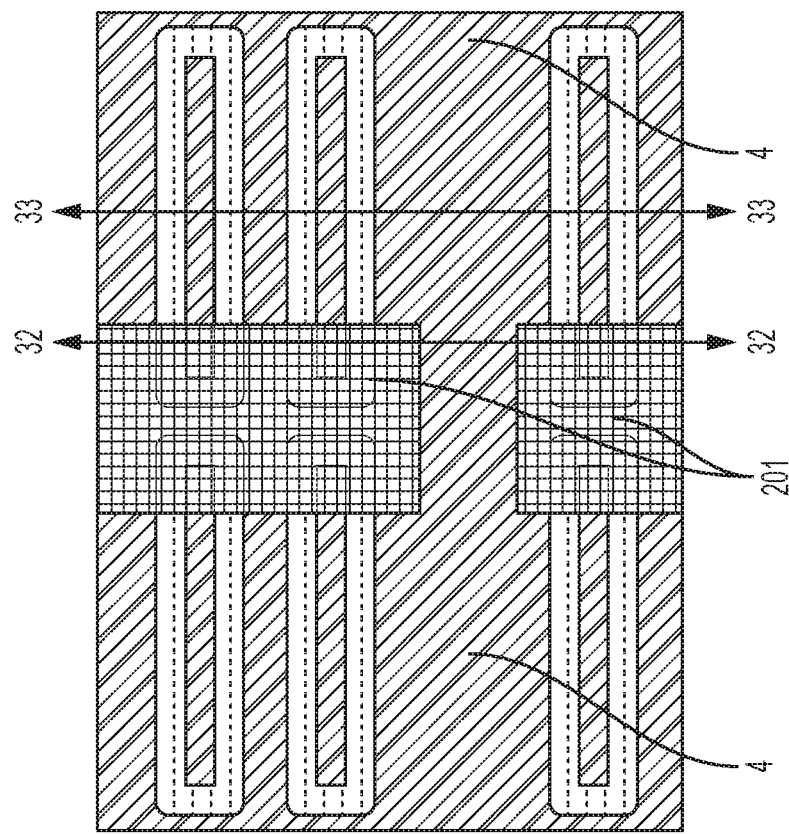

With reference to FIGS. 31-33, a next stage in the method involves gate etching or gate RIE, for example. Here, the material of the top spacer 5 and the recessed metallic layer 6 are etched with the LTO remainder 322 and the LTN remainder 312 in the first band 70 (i.e., with the hard mask 110) as shown in FIG. 32. Such etching will remove the last of the nitride/oxide hard mask and the OPL remainder 201 will help mask the areas in the first band 70 that should continue to include the material of the recessed metallic layer 5. That is, in the areas of the first band 70 and the second bands 71 that are not protected by the OPL remainder 201, the material of the recessed metallic layer 5 will be etched anisotropically and only a small amount of material of the bottom spacer 4 will remain to surround the lower portions of the fins 9. Meanwhile, in the areas of the first band 70 that are protected by the OPL remainder 201, the material of the recessed metallic layer 6 will remain as first and second gate straps 601 and 602 to be described below.

Figure 35:
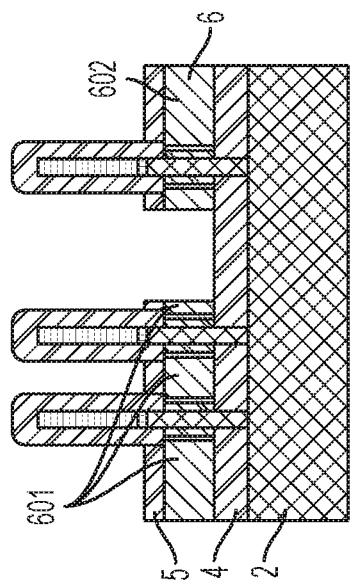
FIG. 35 is a cross-section of the etched device along line 35-35 of FIG. 34.
Figure 36:
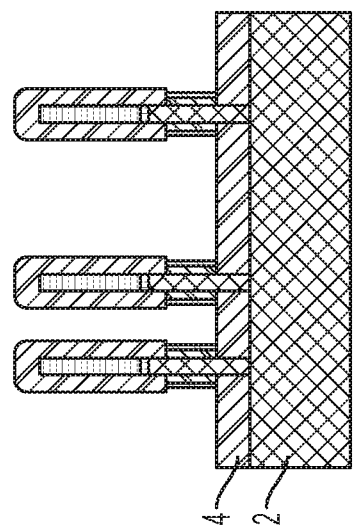
FIG. 36 is a cross-section of the etched device along line 36-36 of FIG. 34.
Figure 34:
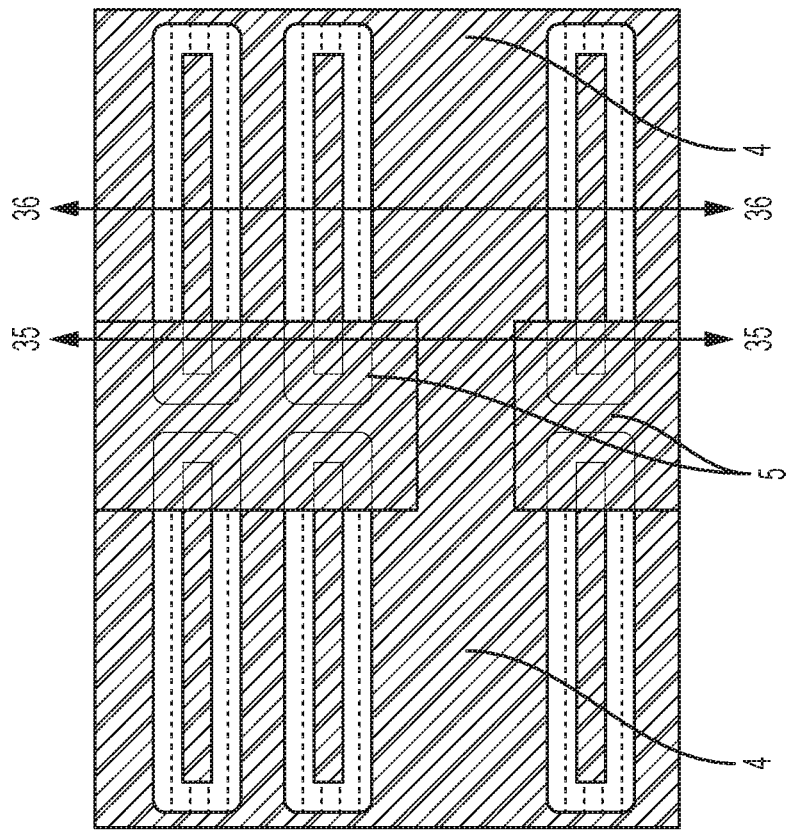

Next, with reference to FIGS. 34-36, the OPL remainder 201 is removed from the first band 70. Such removal may be conducted by a sequence of various etching processes, such as an initial RIE and a subsequent wet etch, and/or by ashing. Thereafter, the first and second gate straps 601 and 602 are formed of the material of the recessed metallic layer 6 (e.g., tungsten) that was protected by the OPL remainder 201 as shown in FIG. 34 and FIG. 35. These first and second gate straps 601 and 602 connect the metal gate assemblies 10 that surround the central portions of the fins 9.

Descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of gate cutting for a device with multiple vertical transistors, the method comprising:

memorizing an initial structure of the device to identify a location for a gate strap to connect a portion of the multiple vertical transistors;

building a bilayer hard mask over the device with a photoresist (PR) opening at the location;

removing successive layers of the bilayer hard mask to identify first and second sections of the device based on a position of the PR opening; and removing remaining layers of the bilayer hard mask and the first section of the device while preserving the second section of the device to form the gate strap.

2. The method according to claim 1, wherein the memorizing of the initial structure of the device comprises:

depositing, at a first band including the location of the gate strap, a first organic planarizing layer (OPL) over an incoming device structure, a bilayer memorization stack over the first OPL, a second OPL over the bilayer memorization stack, a low temperature oxide (LTO) over the second OPL and a PR over the LTO; and depositing, at second bands sandwiching the first band, the first organic planarizing layer (OPL) over the incoming device structure, the bilayer memorization stack over the first OPL, the second OPL over the bilayer memorization stack and the low temperature oxide (LTO) over the second OPL.

3. The method according to claim 2, wherein the bilayer memorization stack comprises a low temperature deposited nitride.

4. The method according to claim 2, wherein the bilayer memorization stack comprises a low temperature deposited oxide.

5. The method according to claim 2, wherein the LTO comprises an oxide anti-reflective coating.

6. The method according to claim 2, wherein the memorizing of the initial structure of the device further comprises successively removing layers at the first and second bands to reveal an LTO of the bilayer memorization stack at the first band.

7. The method according to claim 1, wherein the building of the bilayer hard mask over the device with the PR opening at the location comprises:

depositing, at a first band including the location of the gate strap, a new organic planarizing layer (OPL) over a low temperature oxide (LTO) of a bilayer memorization stack, a new LTO over the new OPL and a partial PR defining an opening at the location of the gate strap over the new LTO; and depositing, at second bands sandwiching the first band, the new OPL over a low temperature nitride (LTN) of the bilayer memorization stack, the new LTO over the new OPL and a full PR over the new LTO.

8. The method according to claim 7, wherein the removing of the successive layers of the bilayer hard mask comprises:

removing a portion of the new LTO at the opening to form an LTO opening;

following removal of the portion of the new LTO, removing the partial PR, the full PR and a portion of the new OPL at the LTO opening to form an OPL opening;

following removal of the partial PR, the full PR and the portion of the new OPL, removing a remainder of the new LTO and a portion of the LTO of the bilayer memorization stack at the OPL opening to form a second LTO opening;

following removal of the remainder of the new LTO and the portion of the LTO of the bilayer memorization stack, removing a remainder of the new OPL and an exposed portion of a low temperature nitride (LTN) of the bilayer memorization stack that is exposed by a remainder of the LTO of the bilayer memorization stack;

following removal of the remainder of the new OPL and the exposed portion, removing an underlying OPL of the bilayer hard mask.

9. The method according to claim 8, wherein the removing comprises etching.

10. The method according to claim 1, wherein the removing of the first section of the device comprises etching.

11. The method according to claim 10, wherein the removing of the remaining layers of the bilayer hard mask comprises etching following the removing of the first section of the device.

12. A method of gate cutting for a device, the method comprising:

forming the device to comprise multiple vertical transistors, an upper spacer and an underlying metallic layer by which each of the multiple vertical transistors are communicative;

identifying a section of the device to be removed such that first and second groups of the multiple vertical transistors are isolated; and removing respective portions of the upper spacer and the underlying metallic layer at the section of the device to isolate the first and second groups of the multiple vertical transistors.

13. The method according to claim 12, wherein the multiple vertical transistors comprise vertical field effect transistors (VFETs).

14. The method according to claim 13, wherein the first group of the VFETs comprises n- and p-type fins and the second group of the VFETs comprises n- and p-type fins.

15. The method according to claim 12, wherein the upper spacer comprises silicon nitride and the underlying metallic layer comprises tungsten.

16. The method according to claim 12, wherein the identifying of the section of the device comprises:

memorizing an initial structure of the device to identify a location of the section; and masking the device remote from the location of the section.

17. A vertical transistor device, comprising:

a semiconductor substrate;

first and second groups of vertical transistors extending upwardly from the semiconductor substrate;

a lower spacer disposed about fins of each of the vertical transistors;

an underlying metallic layer disposed to isolate the vertical transistors of the first group from the vertical transistors of the second group, the underlying metallic layer comprising first and second sections by which the vertical transistors of the first and second groups are communicative, respectively; and an upper spacer disposed about upper portions of each of the vertical transistors, the upper spacer being define an opening associated with a region separating the first and second sections.

18. The vertical transistor device according to claim 17, wherein the vertical transistors comprise vertical field effect transistors (VFETs).

19. The vertical transistor device according to claim 18, wherein the first group of the VFETs comprises n- and p-type fins and the second group of the VFETs comprises n- and p-type fins.

20. The vertical transistor device according to claim 17, wherein the lower and upper spacers comprise silicon nitride and the underlying metallic layer comprises tungsten.

* * * * *